United States Patent
Koong

(10) Patent No.: US 10,453,396 B2
(45) Date of Patent: Oct. 22, 2019

(54) BENDABLE DISPLAY PANEL AND BENDABLE DISPLAY DEVICE INCLUDING THE SAME

(71) Applicant: LG Display Co., Ltd., Seoul (KR)

(72) Inventor: Semin Koong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 15/798,458

(22) Filed: Oct. 31, 2017

(65) Prior Publication Data
US 2018/0122302 A1    May 3, 2018

(51) Int. Cl.
| | | |
|---|---|---|
| G09G 3/3258 | (2016.01) | |
| G09G 3/3266 | (2016.01) | |
| G09G 3/3275 | (2016.01) | |
| G09G 3/3233 | (2016.01) | |
| H01L 51/00 | (2006.01) | |

(52) U.S. Cl.
CPC ......... *G09G 3/3258* (2013.01); *G09G 3/3233* (2013.01); *G09G 3/3266* (2013.01); *G09G 3/3275* (2013.01); *G09G 2300/043* (2013.01); *G09G 2300/0413* (2013.01); *G09G 2320/029* (2013.01); *G09G 2320/0233* (2013.01); *G09G 2320/045* (2013.01); *G09G 2380/02* (2013.01); *H01L 51/0097* (2013.01)

(58) Field of Classification Search
CPC .......... G09G 2320/045; G09G 3/3225; G09G 2300/0413; G09G 2300/043; H04M 1/0268; G06F 1/1652; G06F 2203/04102; H01L 2251/5338
See application file for complete search history.

(56) References Cited

U.S. PATENT DOCUMENTS

| | | | | |
|---|---|---|---|---|
| 2010/0073346 A1* | 3/2010 | Min | ..................... | G09G 3/3291 345/211 |
| 2010/0200278 A1* | 8/2010 | Wang | ................ | G02F 1/133305 174/254 |
| 2014/0183481 A1* | 7/2014 | Lee | ..................... | H01L 27/3213 257/40 |
| 2014/0306985 A1* | 10/2014 | Jeong | ................... | G09G 3/3233 345/601 |
| 2014/0362304 A1* | 12/2014 | Wang | ................... | G06F 3/0412 349/12 |
| 2017/0025061 A1* | 1/2017 | Takizawa | ............ | G09G 3/3233 |

* cited by examiner

*Primary Examiner* — Sanjiv D. Patel
(74) *Attorney, Agent, or Firm* — Polsinelli PC

(57) ABSTRACT

Disclosed are a bendable display panel and a bendable display device including the same, in which dummy pixels for sensing whether bending is made or not are provided in a non-display area. The bendable display panel includes a substrate, including a display area displaying an image and a non-display area surrounding the display area, and a plurality of dummy pixels in the non-display area. A plurality of data lines and a plurality of gate lines are provided in the display and the non-display area.

20 Claims, 5 Drawing Sheets

BENDABLE DISPLAY PANEL AND BENDABLE DISPLAY DEVICE INCLUDING THE SAME

CROSS-REFERENCE TO RELATED APPLICATION

This application claims the benefit of the Korean Patent Application No. 10-2016-0143141 filed on Oct. 31, 2016, which is hereby incorporated by reference in its entirety.

BACKGROUND

Field of the Disclosure

The present disclosure relates to a display device, and more particularly, to a bendable display panel and a bendable display device including the same. Although the present disclosure is suitable for a wide scope of applications, it is particularly suitable for preventing deterioration in bending portions of a bendable display panel and a bendable display device including the same.

Description of the Background

Flat panel display (FPD) devices are applied to various kinds of electronic products such as portable phones, tablet personal computers (PCs), notebook computers, etc. Examples of the FPD devices (hereinafter referred to as a display device) include liquid crystal display (LCD) devices, organic light emitting display devices, etc. Recently, electrophoretic display (EPD) devices have been widely used as one type of FPD devices.

A glass substrate has been used in order for display devices to endure heat occurring in a manufacturing process. For this reason, there has been a limitation in making the display devices light, thin, or flexible.

FIG. 1 is a diagram illustrating a related art bendable display device.

Recently, as illustrated in FIG. 1, bendable display devices which maintain display performance with being bent in various directions like paper are manufactured by using flexible materials which are folded or unfolded like plastic films.

The bendable display device includes a bendable display panel. A plurality of organic light emitting diodes (OLEDs) and a plurality of transistors for driving the OLEDs are provided in a display area 10 of the bendable display panel.

The transistors and the OLEDs become deteriorated as the bendable display device is used. Also, when the bendable display device is bent, a stress is applied to transistors and OLEDs which are provided in bent area A, and for this reason, the transistors and the OLEDs provided in bent area A are more quickly and more severely deteriorated.

However, in the related art bendable display device, pixels provided in bent area A are not compensated for. For this reason, an image having abnormal luminance can be displayed on bent area A.

To provide an additional description, the bendable display panel including the OLEDs is driven by a current driving manner. Therefore, only when constant threshold voltages of the transistors are maintained, images having the same luminance are displayed based on the same data voltages.

However, in the related art bendable display device, deterioration caused by the elapse of time and the non-uniformity of a process is compensated for, but additional compensation for the bent area is not performed.

Moreover, where deterioration caused by the elapse of time and the non-uniformity of a process is not compensated for the bendable display device of the related art. Since bent area A is not compensated for, deterioration can severely occur in bent area A, causing the degradation in quality of the bendable display device.

SUMMARY

Accordingly, the present disclosure is directed to provide a bendable display panel and a bendable display device including the same that substantially obviate one or more problems due to limitations and disadvantages of the related art.

An aspect of the present disclosure is directed to provide a bendable display panel and a bendable display device including the same, in which dummy pixels for sensing the existence of bending portions in a non-display area.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a bendable display panel including a substrate including a display area displaying an image and a non-display area surrounding the display area, a plurality of data lines and a plurality of gate lines being provided in the display and the non-display area, and a plurality of dummy pixels in the non-display area. The plurality of dummy pixels may be arranged to surround the display area. The plurality of dummy pixels may each include a pixel driving circuit. The pixel driving circuit may include a sensing unit sensing a threshold voltage or mobility of a driving transistor included in the pixel driving circuit or a threshold voltage or mobility of an organic light emitting diode included in each of the plurality of dummy pixels.

In another aspect of the present disclosure, there is provided a bendable display device including the bendable display panel, a gate driver driving the plurality of gate lines and a plurality of dummy gate lines, a data driver driving the plurality of data lines and a plurality of dummy data lines, a controller controlling the gate driver and the data driver, and a bending sensing unit converting sensing signals, received from the plurality of dummy pixels, into digital sensing signals to transfer the digital sensing signals to the controller. The controller may determine a bending area of the bendable display panel, based on the digital sensing signals.

In a further aspect of the present disclosure, there is provided a bendable display device comprising a bendable panel having a display area and a non-display area surrounding the display area; a plurality of pixels disposed in the display area; and a plurality of dummy pixels disposed in the non-display area and including a pixel driving circuit configured to determine a bending area of the bendable display panel by sensing analog signals of a threshold voltage or a mobility of a driving transistor of the pixel driving circuit or a threshold voltage or a mobility of an organic light emitting diode of the plurality of dummy pixels, generate a compensation value based on the sensed signals and provide the plurality of pixels in the bending area with the compensation value to output a normal luminance similar to the plurality of pixels in a non-bending area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this disclosure, illustrate aspects of the disclosure and together with the description serve to explain the principle of the disclosure.

In the drawings.

DETAILED DESCRIPTION OF THE DISCLOSURE

Figure 1:
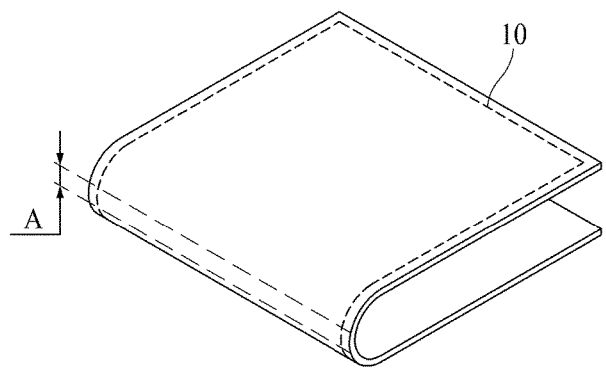
FIG. 1 is a diagram illustrating a related art bendable display device.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings. The present disclosure may be applied to various kinds of display devices using external compensation. In this disclosure below, for convenience of description, an organic light emitting display device will be described as an example of the present disclosure.

Figure 2:
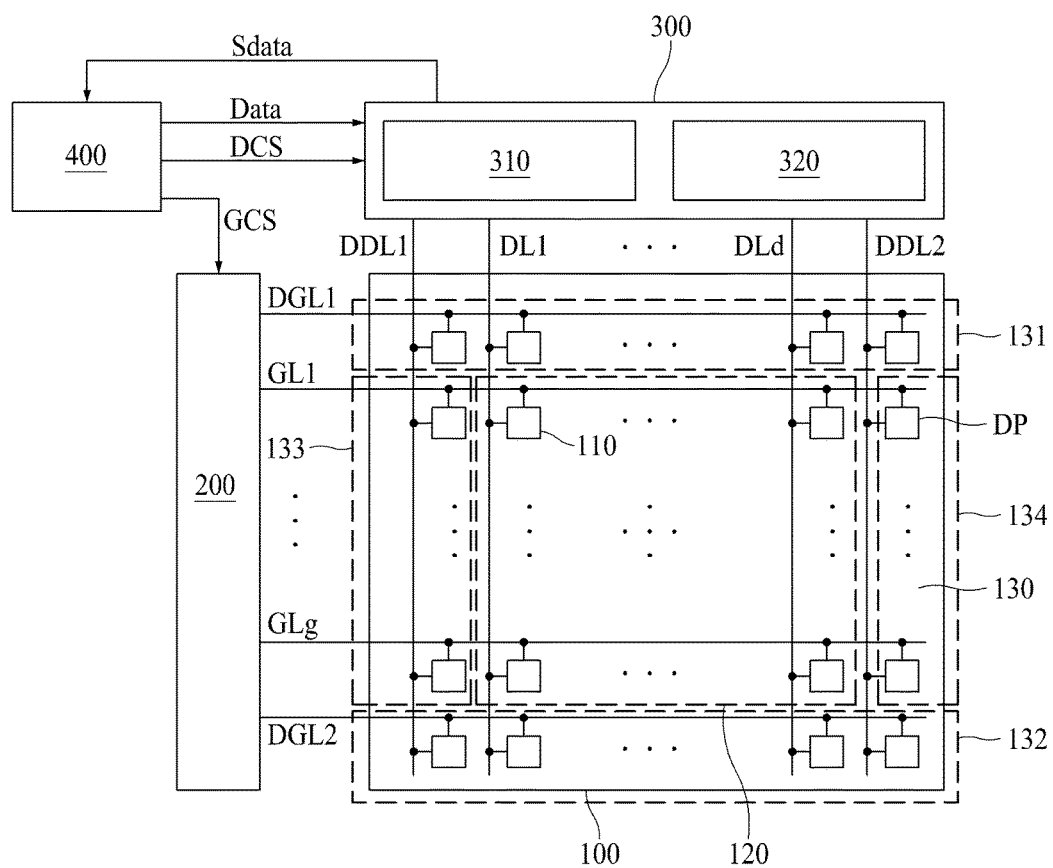
FIG. 2 is an exemplary diagram illustrating a configuration of a bendable display device according to an aspect of the present disclosure.
Figure 3:
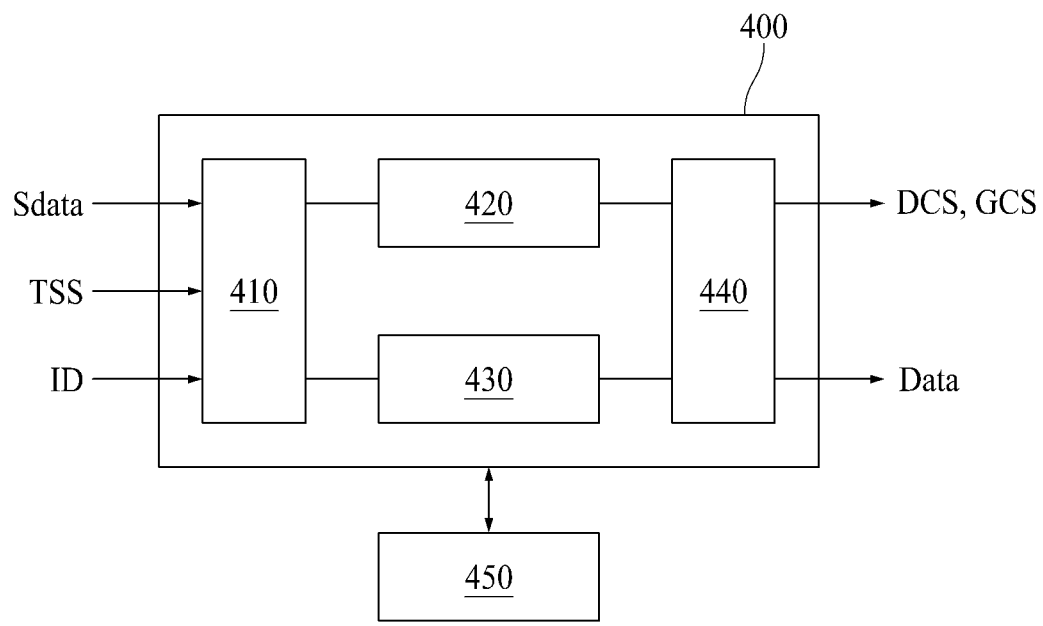
FIG. 3 is an exemplary diagram illustrating a configuration of a controller included in a bendable display device according to an aspect of the present disclosure.
Figure 4:
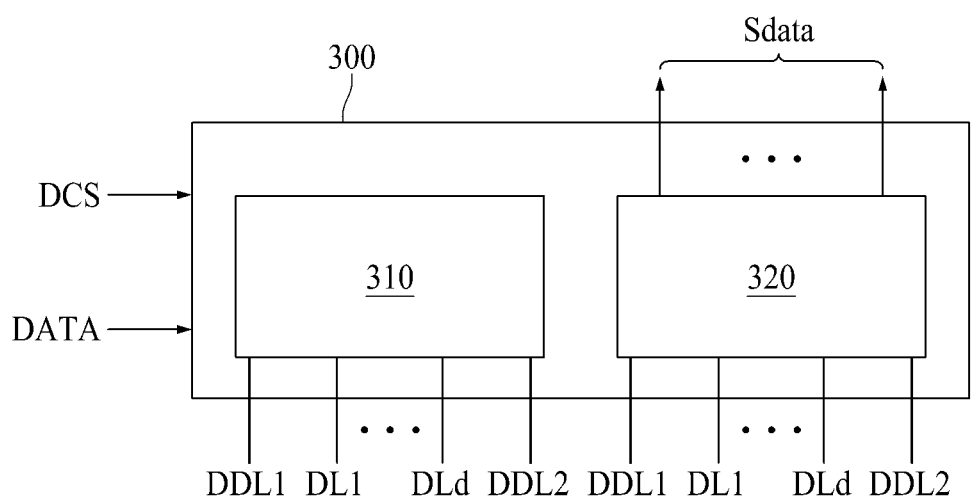
FIG. 4 is an exemplary diagram illustrating a configuration of each of a data driver and a bending sensing unit included in a bendable display device according to an aspect of the present disclosure.

FIG. 2 is an exemplary diagram illustrating a configuration of a bendable display device according to an aspect of the present disclosure. FIG. 3 is an exemplary diagram illustrating a configuration of a controller included in a bendable display device according to an aspect of the present disclosure. FIG. 4 is an exemplary diagram illustrating a configuration of each of a data driver and a bending sensing unit included in a bendable display device according to an aspect of the present disclosure.

The bendable display device according to an aspect of the present disclosure, as illustrated in FIG. 2, may include a bendable display panel 100, a gate driver 200 for driving a plurality of gate lines GL1 to GLg and a plurality of dummy gate lines DGL1 and DGL2, a data driver 310 for driving a plurality of data lines DL1 to DLd and a plurality of dummy data lines DDL1 and DDL2, a controller 400 that controls the gate driver 200 and the data driver 310, and a bending sensing unit 320 that converts sensing signals, received from a plurality of dummy pixels DP, into digital sensing signals and transfers the digital sensing signals to the controller 400.

First, the bendable display panel 100 may include a bendable substrate. The bendable display panel 100 may include the gate lines GL1 to GLg, the dummy gate lines DGL1 and DGL2, the data lines DL1 to DLd, and the dummy data lines DDL1 and DDL2.

The bendable display panel 100 will be described below in detail with reference to FIGS. 2 and 3.

Second, the gate driver 200 may sequentially generate a gate pulse according to a gate control signal GCS supplied from the controller 400 and may sequentially supply the gate pulse to the gate lines GL1 to GLg and the dummy gate lines DGL1 and DGL2.

The gate driver 200 may be directly provided on the bendable display panel 100 in a process of forming a thin film transistor (TFT) of each of a plurality of pixels 110, or may be manufactured as an integrated circuit (IC) type and may be equipped in the bendable display panel 100. The gate driver 200 provided on the bendable display panel 100 may be a gate-in panel (GIP) type.

Third, the data driver 310 may be connected to the data lines DL1 to DLd and the dummy data lines DDL1 and DDL2. The data driver 310 may convert digital image data Data, transferred from the controller 400, into analog data voltages and may supply the data voltages for one horizontal line to the data lines DL1 to DLd and the dummy data lines DDL1 and DDL2 at every period where the gate pulse is supplied to a gate line or a dummy gate line.

The data driver 310 may convert the image data Data into the data voltages by using gamma voltages supplied from a gamma voltage generator (not shown) and may supply the data voltages to the data lines or the dummy data lines.

The data driver 310 may be configured as a single IC along with the controller 400.

Fourth, the controller 400 may control the gate driver 200 and the data driver 310.

The controller 400 may convert video data input from an external system into the image data Data, based on a structure of the bendable display panel 100 and may transfer the image data Data to the data driver 310.

The controller 400 may generate a gate control signal GCS for controlling the gate driver 200 and a data control signal DCS for controlling the data driver 310 and may respectively transfer the gate control signal GCS and the data control signal DCS to the gate driver 200 and the data driver 310.

The controller 400 may generate a sensing unit control signal for controlling the bending sensing unit 320 and may transfer the sensing unit control signal to the bending sensing unit 320.

The controller 400 may analyze digital sensing signals Sdata received from the bending sensing unit 320 to determine a bending area of the bendable display panel 100. The controller 400 may generate compensation values for a plurality of bending pixels corresponding to the bending area. The controller 400 may compensate for input image data corresponding to the bending pixels by using the compensation values and may transfer the compensated image data to the data driver 310. The data driver 310 may output the compensated image data to the data lines DL1 to DLd.

In order to perform the above-described function, as illustrated in FIG. 3, the controller 400 may include a determiner 410, a control signal generator 420, a data aligner 430, and an output unit 440.

The determiner 410 may receive the digital sensing signals Sdata transferred from the bending sensing unit 320, a timing sync signal TSS transferred from the external system, and input video data ID transferred from the external system. The determiner 410 may analyze the digital sensing signals Sdata to determine the bending area. The determiner 410 may generate the compensation values for the bending pixels included in the bending area. The determiner 410 may transfer information about the bending area and the compensation values for the bending pixels to the data aligner 430. However, the information about the bending area and the compensation values for the bending pixels may be stored in a storage unit 450, and then, may be transferred to the data aligner 430.

The control signal generator 420 may generate the gate control signal GCS, the data control signal DCS, and the sensing unit control signal from the timing sync signal TSS.

The data aligner 430 may realign the input video data ID according to a structure of the subpixels 110 to generate the image data Data.

The image data Data may include the compensated image data. For example, when the input video data corresponding to each of the bending pixels is received, the data aligner 430 may compensate for the input video data by using the compensation values and may transfer the compensated image data to the data driver 310.

Fifth, the bending sensing unit 320 may convert sensing signals, received from the dummy pixels DP included in the bendable display panel 100, into the digital sensing signals Sdata and may transfer the digital sensing signals Sdata to the controller 400.

To this end, as illustrated in FIG. 4, the bending sensing unit 320 may be connected to the data lines DL1 to DLd and the dummy data lines DDL1 and DDL2.

The bending sensing unit 320 may be independently provided, or may be configured as a single IC 300 along with the data driver 310.

The bending sensing unit 320 may be driven according to the sensing unit control signal and may sense the threshold voltages, mobility, or deterioration of a plurality of organic light emitting diodes (OLEDs) or a plurality of driving transistors configuring the dummy pixels. The bending sensing unit 320 may convert analog sensing signals, received from the dummy pixels, into the digital sensing signals Sdata and may transfer the digital sensing signals Sdata to the controller 400.

Figure 5:
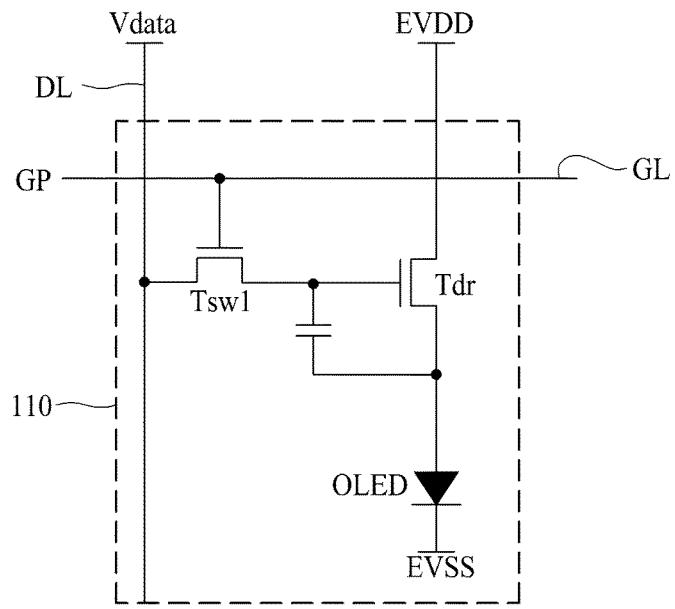
FIG. 5 is an exemplary circuit diagram illustrating a configuration of a pixel included in a bendable display panel according to an aspect of the present disclosure.
Figure 6:
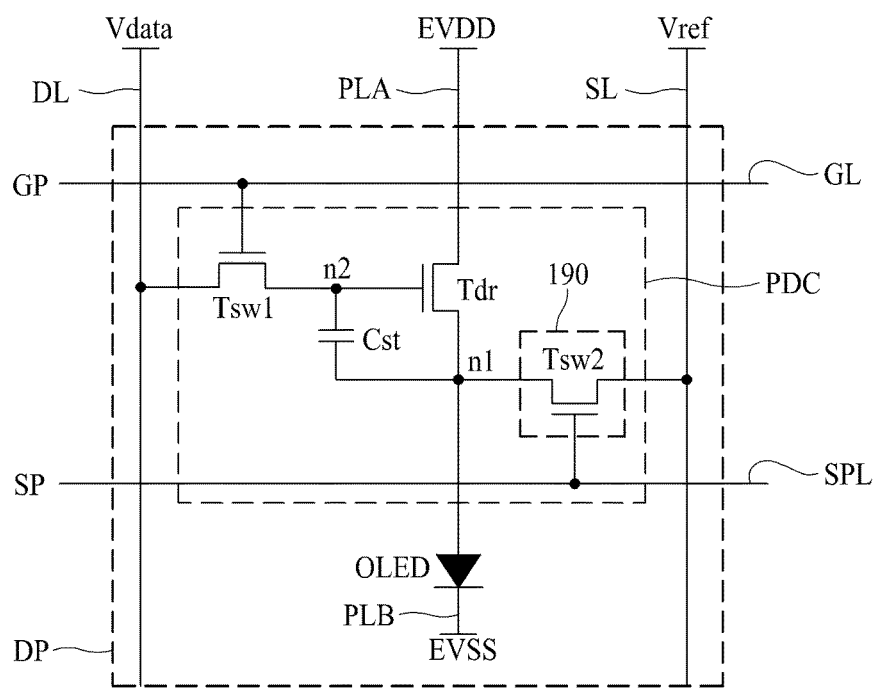
FIG. 6 is an exemplary circuit diagram illustrating a configuration of a dummy pixel included in a bendable display panel according to an aspect of the present disclosure.

FIG. 5 is an exemplary circuit diagram illustrating a configuration of a pixel included in the bendable display panel 100 according to an aspect of the present disclosure, and FIG. 6 is an exemplary circuit diagram illustrating a configuration of a dummy pixel included in the bendable display panel 100 according to an aspect of the present disclosure.

The bendable display panel 100 according to an aspect of the present disclosure may include a substrate and a plurality of dummy pixels DP provided on the substrate.

First, the substrate may include a display area 120, which displays an image, and a non-display area 130 that surrounds the display area 120.

The data lines DL1 to DLd and the gate lines GL1 to GLg may be provided in the display area 120.

The data lines DL1 to DLd and the gate lines GL1 to GLg may also extend to the non-display area 130.

A plurality of pixels 110 defined by the data lines DL1 to DLd and the gate lines GL1 to GLg may be provided in the display area 120.

Each of the pixels 110, as illustrated in FIGS. 2 and 5, may include a switching transistor Tsw1 that is connected to a data line DL and a gate line GL, a driving transistor Tdr that is connected between a first driving power source EVDD and a second driving power source EVSS and includes a gate connected to the switching transistor Tsw1, and an organic light emitting diode OLED that is connected between the driving transistor Tdr and the second driving power source EVSS. A data voltage Vdata may be supplied through the data line DL, and a gate pulse GP may be supplied through the gate line GL.

However, a structure of the pixels 110 is not limited to a structure illustrated in FIG. 5. Therefore, the pixels 110 may be configured in various structures.

For example, the pixel 110 illustrated in FIG. 5 does not include elements for checking the threshold voltage, mobility, or deterioration of the driving transistor Tdr or the organic light emitting diode OLED included in the pixel 110, but may include the elements for checking the threshold voltage, mobility, or deterioration of the driving transistor Tdr or the organic light emitting diode OLED included in the pixel 110. In this case, the pixel 110 may be configured in a structure which is the same as that of a dummy pixel DP illustrated in FIG. 6.

Moreover, the pixels 110 may each include three or more TFTs.

Second, the dummy pixels DP may be arranged to surround the display area 120.

Each of the dummy pixels DP, as illustrated in FIG. 6, may include a pixel driving circuit PDC. The pixel driving circuit PDC may include a sensing unit 190 that senses the threshold voltage or mobility of a driving transistor Tdr included in the pixel driving circuit PDC or the threshold voltage or mobility of an organic light emitting diode OLED configuring a corresponding dummy pixel DP.

The pixel driving circuit PDC, as illustrated in FIG. 6, may include a switching transistor Tsw1 that is connected to the gate line GL and the data line DL, an organic light emitting diode OLED that emits light, a driving transistor Tdr that controls a level of a current output to the organic light emitting diode OLED according to a data voltage Vdata transferred through the switching transistor Tsw1, and a sensing transistor Tsw2.

The sensing transistor Tsw2 may be connected to the sensing line SL and a first node n1 between the driving transistor Tdr and the organic light emitting diode OLED and may be turned on/off by a sensing pulse SP. In a sensing period, the sensing transistor Tsw2 may sense a characteristic of the driving transistor Tdr. The characteristic of the driving transistor Tdr may include a threshold voltage, mobility, and/or the like. Also, during the sensing period, the sensing transistor Tsw2 may sense the threshold voltage or mobility of the organic light emitting diode OLED.

Therefore, the sensing unit 190 may be configured with the sensing transistor Tsw2.

A second node n2 connected to a gate of the driving transistor Tdr may be connected to the switching transistor Tsw1. A storage capacitor Cst may be provided between the second node n2 and the first node n1.

In addition to the structure illustrated in FIG. 6, the pixel driving circuit PDC may be configured in various structures.

To provide an additional description, the pixel driving circuit PDC may be configured in various structures, for sensing the threshold voltage, mobility, or deterioration of the driving transistor Tdr or the organic light emitting diode OLED.

A method of sensing, by the sensing unit 190, the threshold voltage, mobility, or deterioration of the driving transistor Tdr or the organic light emitting diode OLED included in the pixel 110 may use various sensing methods which are currently applicable. The present disclosure relates to a structure and a sensing method of the pixel driving circuit PDC for sensing. Thus, detailed descriptions of the structure and sensing method of the pixel driving circuit PDC for sensing are omitted.

The sensing method will be briefly described below.

The bendable display device according to an aspect of the present disclosure may display an image in an image display period, and in a blank period between one frame and a next frame, may receive analog sensing signals from the dummy pixels to determine the deterioration or not of the dummy pixels.

During the image display period, the controller 400 may generate image data which allow a black image to be displayed on the dummy pixels, and may transfer the image data to the data driver 310. Accordingly, during the image display period, the dummy pixels are not recognized by eyes of a user.

During the blank period, the controller 400 may transfer image data, which is necessary for checking the threshold voltage, mobility, or deterioration of each of the dummy pixels, to the data driver 310. Therefore, during the blank period, the threshold voltage, mobility, or deterioration of each of the dummy pixels may be checked.

Third, as illustrated in FIG. 2, the non-display area 130 may include a first non-display area 131 provided on a first side of the display area 120, a second non-display area 132 facing and in parallel with the first non-display area 131 with the display area 120 therebetween, a third non-display area 133 provided between the first non-display area 131 and the second non-display area 132, and a fourth non-display area 134 facing and in parallel with the third non-display area 133 with the display area 120 therebetween.

The dummy pixels DP may be provided in the first non-display area 131, the second non-display area 132, the third non-display area 133, and the fourth non-display area 134.

To this end, as illustrated in FIG. 2, at least one first dummy gate line DGL1 may be provided in the first non-display area 131, at least one second dummy gate line DGL2 may be provided in the second non-display area 132, at least one first dummy data line DDL1 may be provided in the third non-display area 133, and at least one second dummy data line DDL2 may be provided in the fourth non-display area 134.

In the first non-display area 131, the dummy pixels DP may be provided along the first dummy gate line DGL1 in an area where the first dummy data line DDL1, the second dummy data line DDL2, and the data lines DL1 to DLd intersect the first dummy gate line DGL1.

In the second non-display area 132, the dummy pixels DP may be provided along the second dummy gate line DGL2 in an area where the first dummy data line DDL1, the second dummy data line DDL2, and the data lines DL1 to DLd intersect the second dummy gate line DGL2.

In the third non-display area 133, the dummy pixels DP may be provided along the first dummy data line DDL1 in an area where the first dummy data line DDL1 intersect the gate lines GL1 to GLg.

In the fourth non-display area 134, the dummy pixels DP may be provided along the second dummy data line DDL2 in an area where the second dummy data line DDL2 intersect the gate lines GL1 to GLg.

Hereinafter, a driving method of the bendable display device according to an aspect of the present disclosure will be described with reference to FIGS. 2 to 8C. In description below, details which are the same as or similar to the details described above with reference to FIGS. 2 to 6 are omitted or will be briefly described.

Figure 7A:
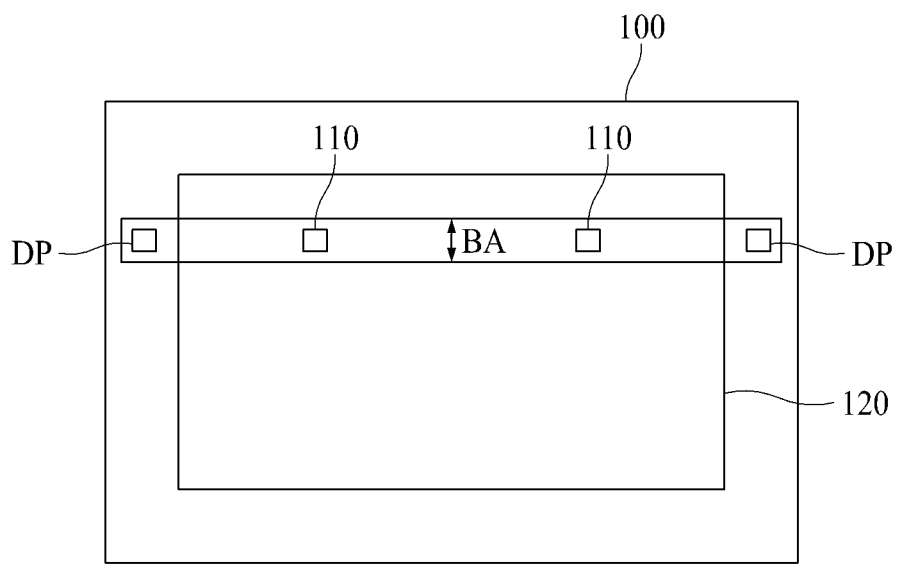
FIGS. 7A and 7B are an exemplary diagram illustrating a bending area of a bendable display device according to an aspect of the present disclosure.
Figure 7B:
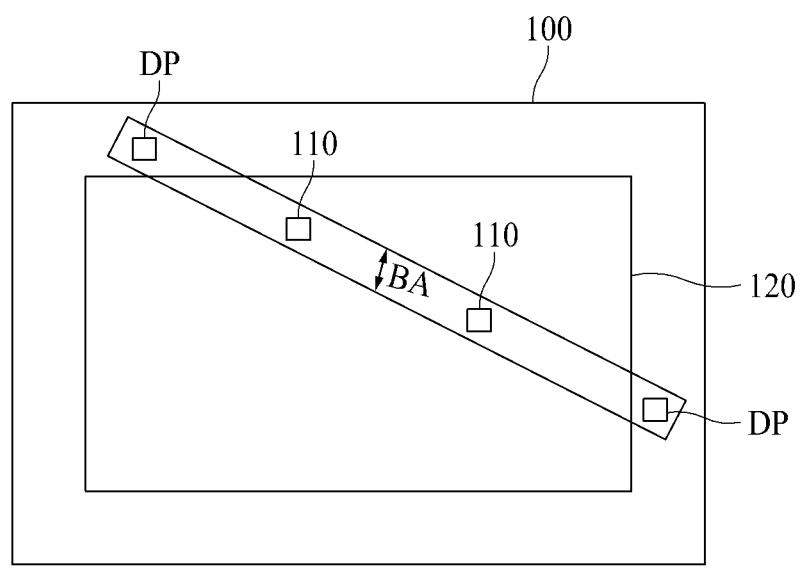
Figure 8A:
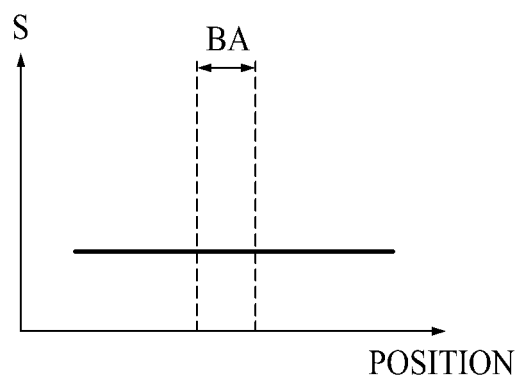
FIGS. 8A to 8C are graphs for describing a driving method of a bendable display device according to an aspect of the present disclosure.
Figure 8B:
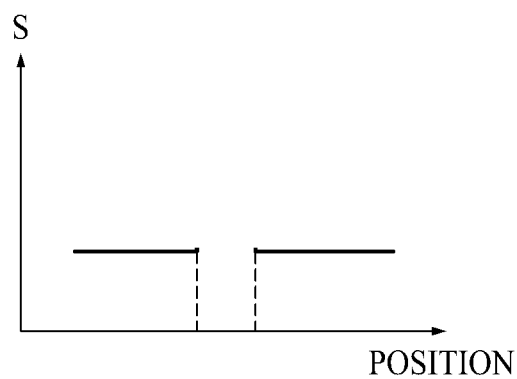
Figure 8C:
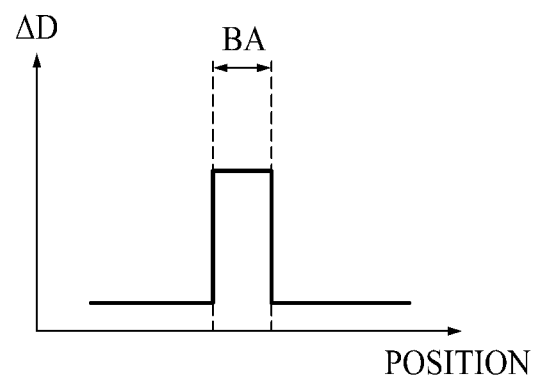

FIGS. 7A and 7B are an exemplary diagram illustrating a bending area of a bendable display device according to an aspect of the present disclosure, and FIGS. 8A to 8C are graphs for describing a driving method of a bendable display device according to an aspect of the present disclosure.

The bendable display panel 100 may be bent in a type illustrated in FIG. 7A or 7B.

For example, in FIG. 7A, the bendable display panel is illustrated as being bent in a direction crossing the third non-display area 133 and the fourth non-display area 134. In FIG. 7B, the bendable display panel is illustrated as being bent in a direction crossing the first non-display area 131 and the fourth non-display area 134.

When the bendable display panel is bent as in FIG. 7A or 7B, a degree of deterioration of each of driving transistors Tdr and organic light emitting diodes OLED included in pixels 110 and dummy pixels DP provided in a bending area BA is not high at the initial bending stage.

Therefore, as illustrated in FIG. 8A, levels of sensing signals S received from driving transistors Tdr and organic light emitting diodes OLED included in a whole area of the bendable display panel are approximately similar Here, the sensing signals S may denote the threshold voltages, mobility, or separately measurable deterioration of the driving transistors Tdr or the organic light emitting diodes OLED.

However, when the bendable display panel is continuously bent in the type illustrated in FIG. 7A or 7B, levels of sensing signals received from pixels 110 and dummy pixels DP provided in the bending area BA become higher than levels of sensing signals received from pixels 110 and dummy pixels DP provided in an area other than bending area BA.

For example, as illustrated in FIG. 8B, the levels of the sensing signals received from the pixels 110 and the dummy pixels DP provided in the bending area BA become higher than the levels of the sensing signals received from the pixels 110 and the dummy pixels DP provided in the area other than bending area BA.

The controller 400 may determine, as bending area BA, an area where the levels of the sensing signals are high, namely, an area where the driving transistors Tdr or the organic light emitting diodes OLED are greatly deteriorated.

In this case, as illustrated in FIG. 8C, the controller 400 may generate compensation values "AD" for pixels (hereinafter referred to as a bending pixel) corresponding to bending area BA.

The compensation values "AD" may be values that allow normal luminance to be realized in the bending pixels.

For example, if the bending pixels are deteriorated, despite the same data voltage being supplied to all the pixels of the bendable display panel 100, the luminance of an image displayed on the bending pixels becomes lower than that of an image displayed on pixels other than bending area BA.

Therefore, the compensation values "AD" may be values that are calculated in order for an image based on input video data corresponding to the bending pixels to have a normal luminance.

When the input video data is received from the external system, the controller 400 may compensate for the input video data corresponding to the bending pixels by using the compensation values and may transfer image data, obtained through the compensation, to the data driver 310.

The data driver 310 may output the image data, obtained through the compensation, to the data lines DL1 to DLd.

Therefore, the luminance of bending area BA where deterioration occurs has a normal value.

As described above, according to the aspects of the present disclosure, the dummy pixels are provided in the non-display area for sensing the bending area. t Accordingly, pixels including transistors or OLEDs deteriorated by a bending operation can be compensated. Accordingly, an image having a normal luminance can be displayed even on a bending area.

Moreover, according to the aspects of the present disclosure, a bending area may be determined based on the dummy pixels which are formed along with pixels provided in the display area. Therefore, a separate sensor for determining the bending area is not needed in the non-display area through an additional process. Accordingly, a process of manufacturing the bendable display device can be simplified, and the manufacturing cost can be reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A bendable display panel comprising:
   a plurality of data lines and gate lines, a display area displaying an image and a non-display area surrounding the display area on a substrate; and a plurality of dummy pixels in the non-display area, surrounding the display area, and each pixel comprising a pixel driving circuit,
   wherein the pixel driving circuit comprises a sensing unit sensing a threshold voltage or mobility of a driving transistor of the pixel driving circuit or a threshold voltage or a mobility of an organic light emitting diode of each pixel of the plurality of dummy pixels,
   wherein the bendable display panel includes a plurality of bending pixels among the plurality of dummy pixels corresponding to a bending area that is determined based on the threshold voltage or the mobility of the plurality of dummy pixels, and
   wherein the pixel driving circuit generates compensation values based on the threshold voltage or the mobility of the plurality of dummy pixels.

2. The bendable display panel of claim 1, wherein the non-display area comprises:
   a first non-display area disposed in the non-display area;
   a second non-display area facing and in parallel with the first non-display area with the display area therebetween;
   a third non-display area disposed between the first area and the second non-display area; and
   a fourth non-display area facing and in parallel the third non-display area with the display area therebetween, and the plurality of dummy pixels are disposed in the first non-display area, the second non-display area, the third non-display area, and the fourth non-display area.

3. The bendable display panel of claim 2, wherein the first non-display area has a first dummy gate line, the second non-display area has a second dummy gate line, the third non-display area has a first dummy data line, and the fourth non-display area has a second dummy data line.

4. The bendable display panel of claim 3, wherein the plurality of dummy pixels is disposed along the first dummy gate line in the first non-display area where the first dummy data line, the second dummy data line, and the plurality of data lines intersect the first dummy gate line,
the plurality of dummy pixels is disposed along the second dummy gate line in the second non-display area where the first dummy data line, the second dummy data line, and the plurality of data lines intersect the second dummy gate line,
the plurality of dummy pixels is disposed along the first dummy data line in the third non-display area where the first dummy data line intersects the plurality of gate lines, and
the plurality of dummy pixels is disposed along the second dummy data line in the fourth non-display area where the second dummy data line intersects the plurality of gate lines.

5. A bendable display device comprising:
a bendable display panel including a plurality of data lines and gate lines, a display area displaying an image, a non-display area surrounding the display area on a substrate, a plurality of dummy pixels in the non-display area, surrounding the display area, and each pixel including a pixel driving circuit,
wherein the pixel driving circuit includes a sensing unit sensing a threshold voltage or a mobility of a driving transistor of the pixel driving circuit or a threshold voltage or a mobility of an organic light emitting diode of each pixel of the plurality of dummy pixels;
a gate driver driving the plurality of gate lines and a plurality of dummy gate lines;
a data driver driving the plurality of data lines and a plurality of dummy data lines;
a controller controlling the gate driver and the data driver; and
a bending sensing unit converting sensing signals, received from the plurality of dummy pixels, into digital sensing signals to transfer the digital sensing signals to the controller,
wherein the controller determines a bending area of the bendable display panel, based on the digital sensing signals, and
wherein the controller generates compensation values for a plurality of bending pixels corresponding to the bending area by using the digital sensing signals.

6. The bendable display device of claim 5, wherein the controller compensates for input video data corresponding to the plurality of bending pixels by using the compensation values, and transfers image data, obtained through the compensation, to the data driver.

7. The bendable display device of claim 6, wherein the data driver outputs the image data, obtained through the compensation, to the plurality of data lines.

8. The bendable display device of claim 5, wherein the non-display area comprises:
a first non-display area disposed in the non-display area;
a second non-display area facing and in parallel with the first non-display area with the display area therebetween;
a third non-display area disposed between the first non-display area and the second non-display area; and
a fourth non-display area facing and in parallel with the third non-display area with the display area therebetween,
wherein the plurality of dummy pixels is disposed in the first non-display area, the second non-display area, the third non-display area, and the fourth non-display area.

9. The bendable display device of claim 8, wherein the first non-display area has a first dummy gate line, the second non-display area has a second dummy gate line, the third non-display area has a first dummy data line, and the fourth non-display area has a second dummy data line.

10. A bendable display device, comprising:
a bendable panel having a display area and a non-display area surrounding the display area;
a plurality of pixels disposed in the display area; and
a plurality of dummy pixels disposed in the non-display area and including a pixel driving circuit configured to determine a bending area of the bendable display panel by sensing analog signals of a threshold voltage or a mobility of a driving transistor of the pixel driving circuit or a threshold voltage or a mobility of an organic light emitting diode of the plurality of dummy pixels, generate a compensation value based on the sensed signals and provide the plurality of pixels in the bending area with the compensation value to output a normal luminance similar to the plurality of pixels in a non-bending area.

11. The bendable display device of claim 10, wherein the bendable display displays an image during an image display period and receives the sensed signals from the plurality of dummy pixels during a blank period between frames to determine deterioration of the plurality of dummy pixels.

12. The bendable display device of claim 10, further comprising a controller generating input image data allowing a black image to be displayed on the dummy pixels during the image display period.

13. The bendable display device of claim 12, wherein the compensation value for the plurality of dummy pixels is generated by the controller.

14. The bendable display device of claim 12, further comprising a plurality of data drivers receiving the input image data from the controller.

15. The bendable display device of claim 14, wherein the data drivers output the input image data to the plurality of data lines.

16. The bendable display device of claim 12, further comprising a bending sensing unit converting the analog sensing signals received from the plurality of dummy pixels into digital sensing signals and outputting the digital sensing signals to the controller.

17. The bendable display panel of claim 10, wherein the non-display area comprises:
a first non-display area disposed in the non-display area;
a second non-display area facing and in parallel with the first non-display area with the display area therebetween;
a third non-display area disposed between the first area and the second non-display area; and
a fourth non-display area facing and in parallel the third non-display area with the display area therebetween, wherein the plurality of dummy pixels is disposed in the first non-display area, the second non-display area, the third non-display area, and the fourth non-display area.

18. The bendable display panel of claim 17, wherein the first non-display area has a first dummy gate line, the second non-display area has a second dummy gate line, the third non-display area has a first dummy data line, and the fourth non-display area has a second dummy data line.

19. The bendable display panel of claim 18, wherein the plurality of dummy pixels is disposed along the first dummy gate line in the first non-display area where the first dummy data line, the second dummy data line, and the plurality of data lines intersect the first dummy gate line, and the plurality of dummy pixels is disposed along the second dummy gate line in the second non-display area where the first dummy data line, the second dummy data line, and the plurality of data lines intersect the second dummy gate line.

20. The bendable display panel of claim 18, wherein the plurality of dummy pixels is disposed along the first dummy data line in the third non-display area where the first dummy data line intersects the plurality of gate lines, and the plurality of dummy pixels is disposed along the second dummy data line in the fourth non-display area where the second dummy data line intersects the plurality of gate lines.

\* \* \* \* \*